United States Patent [19]
Itoh et al.

[11] Patent Number: 5,410,278
[45] Date of Patent: Apr. 25, 1995

[54] RING OSCILLATOR HAVING A VARIABLE OSCILLATING FREQUENCY

[75] Inventors: Nobuhiko Itoh, Tenri; Makoto Ihara, Sakurai, both of Japan

[73] Assignee: Sharp Kabushiki Kaisha, Osaka, Japan

[21] Appl. No.: 992,579

[22] Filed: Dec. 18, 1992

[30] Foreign Application Priority Data

Dec. 19, 1991 [JP] Japan .................................. 3-337063

[51] Int. Cl.⁶ ........................ H03B 1/00; G11C 7/00
[52] U.S. Cl. ............................................. 331/57; 331/65; 365/222; 365/227
[58] Field of Search .................. 331/57, 177 R, 65; 365/189.09, 222, 223, 227, 201; 307/296.2, 296.6, 296.7

[56] References Cited

U.S. PATENT DOCUMENTS

| | | | |
|---|---|---|---|
| 4,388,537 | 6/1983 | Kanuma | 307/297 |
| 4,682,306 | 7/1987 | Sakurai et al. | 365/222 |
| 4,853,654 | 8/1989 | Sakurai | 331/57 |

FOREIGN PATENT DOCUMENTS

| | | | |
|---|---|---|---|
| 0128427 | 12/1984 | European Pat. Off. | 365/222 |
| 0207089 | 11/1984 | Japan | 365/222 |
| 0212896 | 10/1985 | Japan | 365/222 |
| 61-50287 | 3/1986 | Japan | 365/222 |
| 0154293 | 7/1987 | Japan | 365/222 |
| 0149296 | 6/1989 | Japan | 365/222 |

OTHER PUBLICATIONS

"Master Storage Cell to Initiate Refreshing of Dynamic Memory Chip", by R. E. Johnson & W. F. Stinson, vol. 20, No. 11A, Apr. 1978, IBM Tech. Disc. Bulletin.

Primary Examiner—Robert J. Pascal
Assistant Examiner—Arnold Kinkead
Attorney, Agent, or Firm—Morrison & Foerster

[57] ABSTRACT

A ring oscillator includes a plurality of inverters, a leakage current generating part, and a current controlling part. The current controlling part supplies the inverters with a source current in accordance with a value of a leakage current generated from the leakage current generating part. The leakage current generated from the leakage current generating part is correlated with a leakage current generated from a memory cell. The oscillating frequency of the ring oscillator can be varied in accordance with the leakage current generated from the leakage current generating part.

14 Claims, 4 Drawing Sheets

RING OSCILLATOR HAVING A VARIABLE OSCILLATING FREQUENCY

BACKGROUND OF THE INVENTION

1. Field of the Invention

The present invention relates to a ring oscillator formed on an integrated circuit such as a timer circuit for performing self refresh of DRAM (dynamic random access memory) and PSRAM (pseudo static random access memory), etc.

2. Description of the Related Art

As is shown in FIG. 4, a conventional ring oscillator formed on an integrated circuit such as a timer circuit for a semiconductor memory device comprises an odd number of inverters 111a, 111b and 111c, an inverter 111d, and a delay circuit 112. The inverters 111a, 111b and 111c are connected to each other so as to make a ring, and the inverter 111d and the delay circuit 112 are inserted in the ring of the ring oscillator. Accordingly, a signal outputted from the delay circuit 112 is inverted via the odd number of inverters 111a, 111b and 111c. Then the signal outputted from the inverter 111c is inputted into the inverter 111d. Therefore, the ring oscillator oscillates in a frequency in accordance with the time required for the passage of the signal through the odd number of inverters 111a, 111b and 111c, and the inverter 111d, and the time delayed in the delay circuit 112.

The oscillating frequency of a conventional ring oscillator is varied in accordance with the time delayed in the delay circuit 112. The time delayed in the delay circuit 112 is varied in accordance with the time period from the time when an output level of the inverter 111d becomes low (L) to the time when a terminal voltage level of a capacitor C charged via a resistor R becomes high (H). Therefore, the oscillating frequency can be varied by suitably changing the time constant of a circuit formed of the resistor R and the capacitor C.

The resistor R and the capacitor C are formed on the integrated circuit. Accordingly, the oscillating frequency of the conventional ring oscillator is determined based on the resistance value of the resistor R and the capacitance value of the capacitor C. The oscillating frequency of the ring oscillator formed on the integrated circuit is not correlated with the leakage current generated from a memory cell. Moreover, when the ring oscillator is used for performing self refresh of the memory cell, the oscillating frequency should be determined based on the case where the amount of the leakage current generated from the memory cell is the largest. Therefore, there is a disadvantage in that the ring oscillator unnecessarily performs the self refresh when the amount of the leakage current generated from the memory cell is not so large.

SUMMARY OF THE INVENTION

The ring oscillator of this invention comprises a plurality of inverters, a leakage current generating part, and a current controlling part for supplying the inverters with a source current in accordance with the value of the leakage current generated from the leakage current generating part.

Thus, the invention described herein makes possible the advantage of providing a ring oscillator in which the oscillating frequency thereof can be varied by the leakage current generated from a leakage current generating part, thereby not performing unnecessary self refresh.

This and other advantages of the present invention will become apparent to those skilled in the art upon reading and understanding the following detailed description with reference to the accompanying figures.

BRIEF DESCRIPTION OF THE DRAWINGS

FIG. 2b is a graph showing the correlation between a leakage current generated from a memory cell and a leakage current generated from the leakage current generating part shown in FIG. 2a.

FIG. 3b is a graph showing the relationship between an input voltage and an output voltage of the inverter shown in FIG. 3a.

DESCRIPTION OF THE PREFERRED EMBODIMENTS

Hereinafter, the present invention will be described by way of illustrating an example referring to figures.

Figure 1:
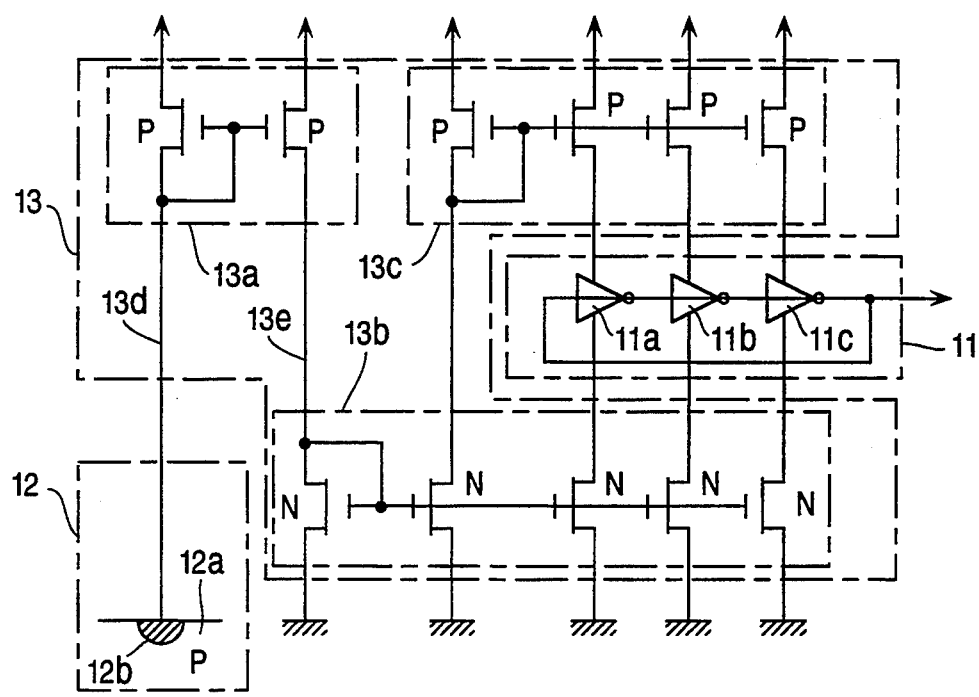
FIG. 1 is a circuit block diagram of a ring oscillator according to an example of the present invention.

As is shown in FIG. 1, a ring oscillator according to an example of the present invention comprises an inverter section 11, a leakage current generating part 12, and a current controlling part 13. In the inverter section 11, three inverters 11a, 11b, and 11c are connected to each other so as to make a ring. Therefore, a signal inputted into the inverter 11a is inverted via the inverters 11a, 11b, and 11c. Therefore, the ring oscillator oscillates in a frequency in accordance with the time required for the passage of the signal through these inverters 11a, 11b, and 11c.

Figure 3A:
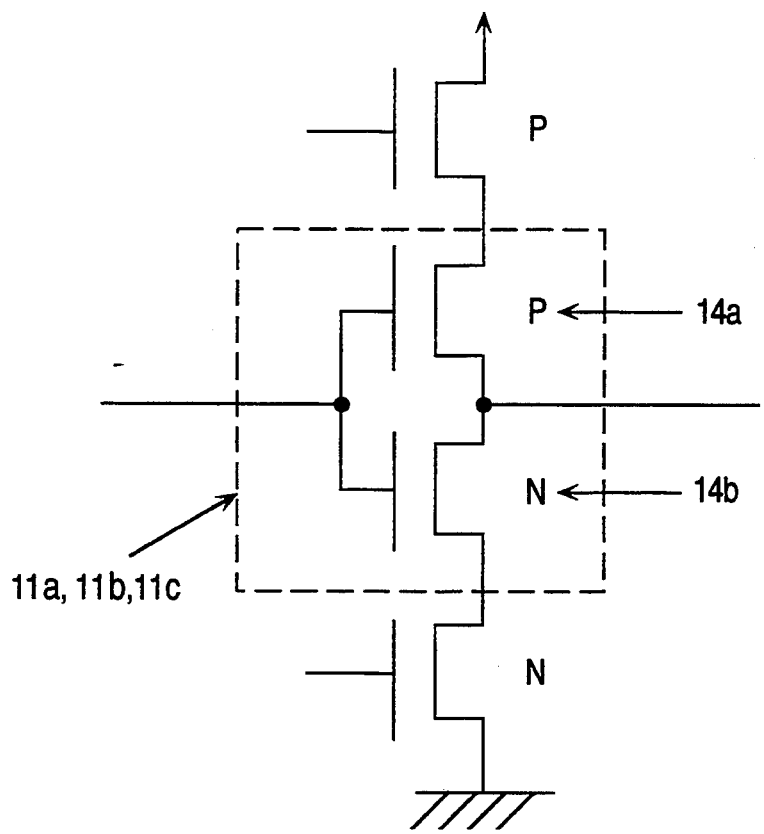
FIG. 3a is a circuit diagram of an inverter included in the ring oscillator shown in FIG. 1.
Figure 3B:
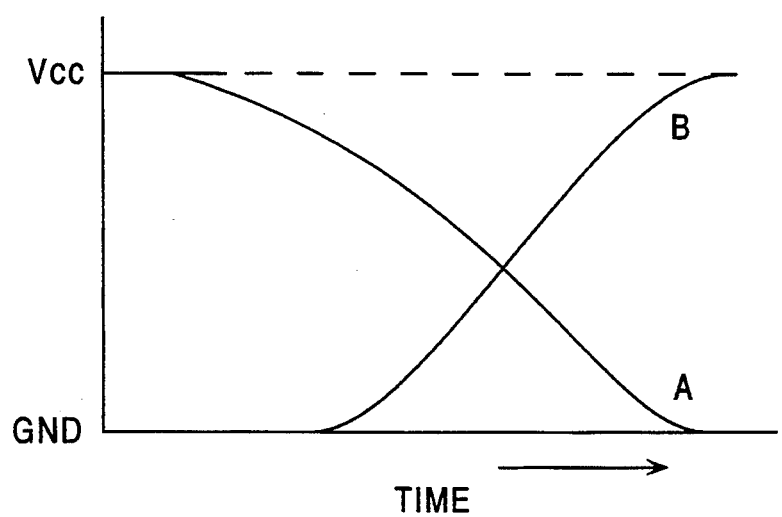
Figure 4:
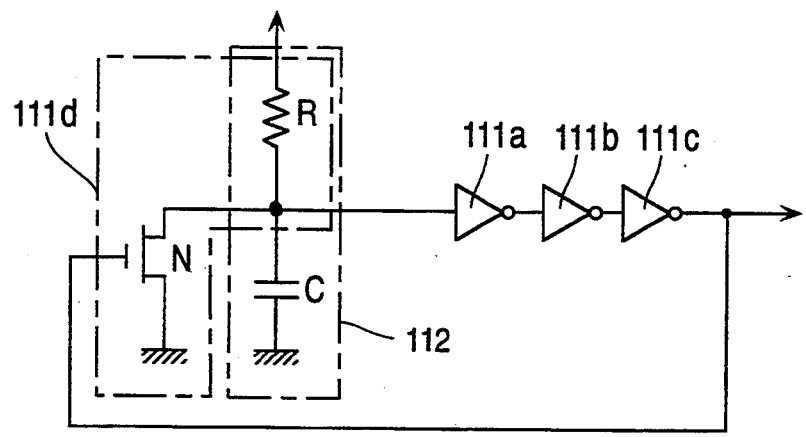
FIG. 4 is a circuit block diagram of a conventional ring oscillator.

The inverters 11a, 11b, and 11c each have an identical construction. Therefore, hereinafter the inverter according to the present example will be described referring to the inverter 11a. FIG. 3a shows a circuit diagram of the inverter 11a. As is shown in FIG. 3a, the inverter 11a is formed of a p-channel MOSFET (metal oxide semiconductor field effect transistors) 14a as a charge element and an n-channel MOSFET 14b as a drive element. A gate of the p-channel MOSFET 14a is connected to a gate of the n-channel MOSFET 14b. A signal to be inputted into the inverter 11a is applied to both gates of the p-channel MOSFET 14a and n-channel MOSFET 14b. A drain of the p-channel MOSFET 14a is connected to a drain of the n-channel MOSFET 14b. A node of the drains of the p-channel MOSFET 14a and n-channel MOSFET 14b is an output terminal of the inverter 11a. FIG. 3b shows the relationship between the input voltage "A" and the output voltage "B" of the inverter 11a shown in FIG. 3a.

Figure 2A:
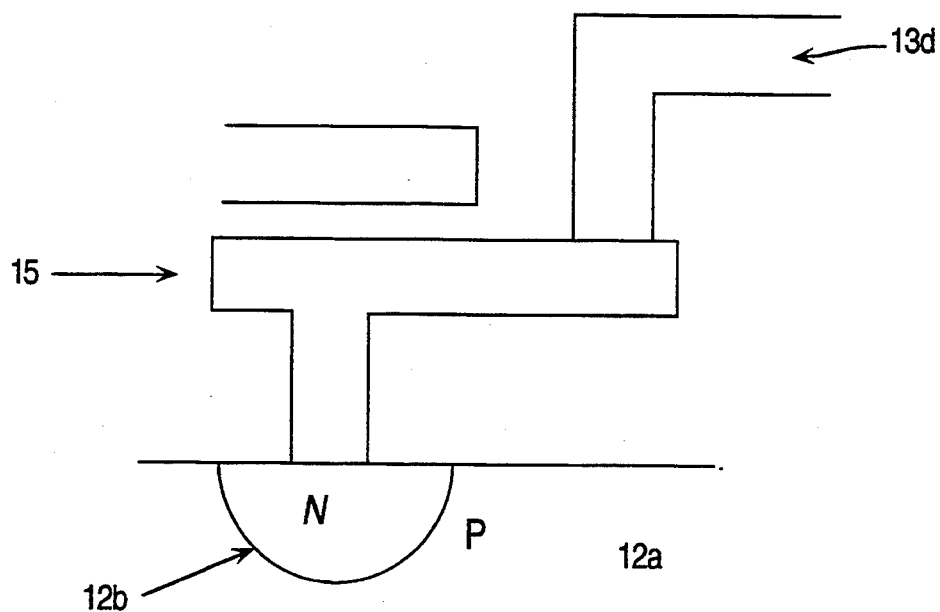
FIG. 2a is a detailed diagram of a leakage current generating part included in the ring oscillator shown in FIG. 1.
Figure 2B:
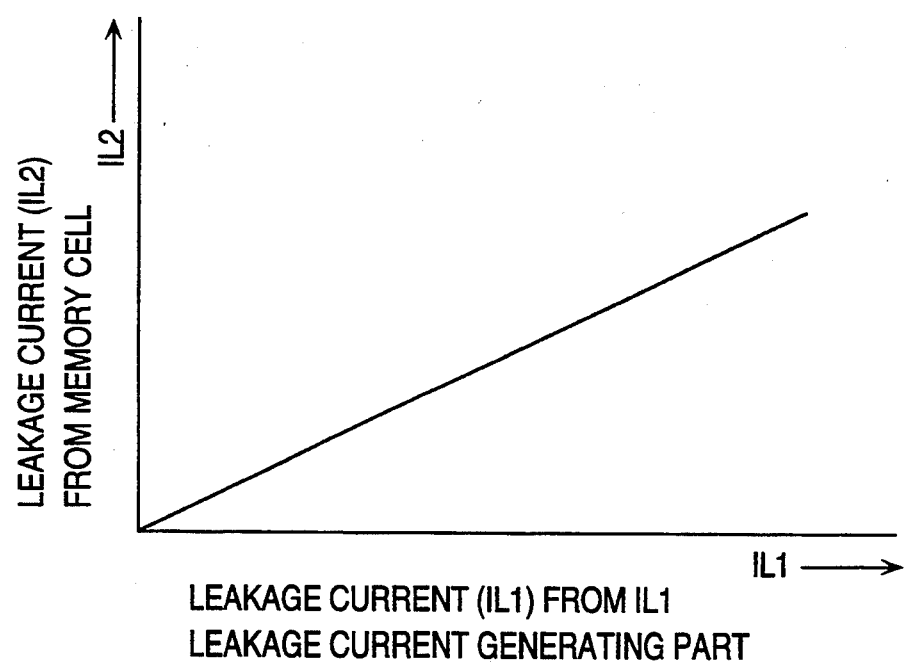

As is shown in FIG. 2a, the leakage current generating part 12 comprises a p-type semiconductor substrate 12a and an n-type diffusion region 12b. A voltage is applied in a reverse direction to the n-type diffusion region 12b via the current controlling part 13. The n-type diffusion region 12b is connected to a node 13d where the potential is detected via a node 15 where the charge is stocked. A leakage current generated from the leakage current generating part 12 is correlated with a leakage current generated from a memory cell. The leakage current generated from the leakage current generating part 12 flows in a direction from the n-type diffusion region 12b to the p-type semiconductor substrate 12a. The correlation between the leakage current (IL1) generated from the leakage current generating part 12 and the leakage current (IL2) generated from the memory cell is shown in FIG. 2b. The n-type diffusion region 12b is preferably formed as an n+ well or n− well.

The current controlling part 13 comprises three current mirror circuits 13a, 13b, and 13c. The current mirror circuits 13a, 13b, and 13c each comprise a plurality of MOSFETs. In each of the current mirror circuits 13a, 13b, and 13c, a drain terminal of one of the MOSFETs, where the potential is detected, is connected to gate terminals of the other MOSFETs. The current mirror circuit 13a comprises two p-channel MOSFETs. A voltage is applied in a reverse direction to the n-type diffusion region 12b of the leakage current generating part 12 via one of the MOSFETs where the potential is detected. The amplification degree of the current mirror circuit 13a is changed by varying each size of the two MOSFETs of the current mirror circuit 13a. The leakage current flowing through the node 13d of the MOSFET where the potential is detected is amplified by the current mirror circuit 13a. The amplified leakage current is outputted to a node 13e connected to the other MOSFET where the potential is not detected in the current mirror circuit 13a. The current mirror circuit 13b comprises five n-channel MOSFETs. One of the five MOSFETs, where the potential is detected, is connected to the node 13e. The current mirror circuit 13c comprises four p-channel MOSFETs. A drain of one of the four MOSFETs of the current mirror circuit 13c, where the potential is detected, is connected to one of the remaining MOSFETs of the current mirror circuit 13b. The remaining three MOSFETs of the current mirror circuit 13b are connected to power source terminals of the three inverters 11a, 11b, and 11c, respectively. Similarly, the remaining three MOSFETs of the current mirror circuit 13c are connected to power source terminals of the three inverters 11a, 11b, and 11c, respectively. The inverter section 11 is disposed between the current mirror circuits 13b and 13c.

According to the above configuration, the leakage current generated from the leakage current generating part 12 is amplified by the current mirror circuit 13a and is outputted to the node 13e via the current mirror circuit 13a. The outputted current is supplied to each power source terminal of the inverters 11a, 11b, and 11c via the current mirror circuits 13b and 13c. As a result, when the leakage current generated from the leakage current generating part 12 is increased, the source current to the inverters 11a, 11b, and 11c is increased, so that the inverters 11a, 11b, and 11c operate at a high speed, thereby increasing the oscillating frequency of the ring oscillator. On the other hand, when the leakage current generated from the leakage current generating part 12 is decreased, the source current to the inverters 11a, 11b, and 11c is decreased, so that the inverters 11a, 11b, and 11c operate at a low speed, thereby decreasing the oscillating frequency of the ring oscillator.

When the leakage current generated from the memory cell is increased, the refresh cycle of the memory cell is shortened. As is shown in FIG. 2b, when the leakage current generated from the memory cell is increased, the leakage current generated from the leakage current generating part 12 is increased. According to the present example, when the leakage current generated from the leakage current generating part 12 is increased, the source current to the inverter section 11 is increased. When the source current to the inverter section 11 is increased, the inverters 11a, 11b, and 11c operate at a high speed, thereby shortening the propagation delay time of the inverter section 11. Then, when the propagation delay time of the inverter section 11 is shortened, the oscillating frequency of the ring oscillator is increased. Accordingly, as the leakage current generated from the memory cell is increased, the oscillating frequency of the ring oscillator is increased.

Moreover, a leakage current is generated from the leakage current generating part 12 in the same process as a leakage current is generated from the memory cell, so that the two leakage currents are correlated with each other by their properties, for example, a temperature characteristic. The current controlling part 13 amplifies the leakage current generated from the leakage current generating part 12. The amplified or unamplified leakage current is supplied to the inverter section 11 as a source current. Therefore, when the leakage current generated from the leakage current generating part 12 is increased, the source current to the inverter section 11 is increased, so that each inverter operates at a high speed. As a result, the oscillating frequency of the ring oscillator is increased.

On the other hand, when the leakage current is decreased, the source current is decreased, so that each inverter operates at a low speed. As a result, the oscillating frequency of the ring oscillator is decreased.

Therefore, in the ring oscillator according to the present invention, the oscillating frequency of the ring oscillator can be varied in accordance with the value of the leakage current generated from the leakage current generating part 12.

The leakage current generating part 12 of the ring oscillator preferably has an identical configuration to that of the memory cell, for example, a configuration in which a voltage is applied in a reverse direction to an n-type diffusion region located in a p-type semiconductor substrate or a p well.

As is apparent from the above description, in the ring oscillator of the present invention, it is possible to vary the oscillating frequency by changing the leakage current generated from the leakage current generating part 12, thereby obtaining the oscillating frequency in proportion to the leakage current generated from the memory cell.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ring oscillator, comprising:
   a leakage current generating means for generating a leakage current;
   a current controlling means for generating a source current by amplifying the leakage current generated from the leakage current generating means, a value of the source current varying in accordance with a value of the leakage current generated from the leakage current generating means; and a plurality of inverters which receive the source current from the current controlling means, wherein the plurality of inverters operate at an operating speed determined by the value of the source current, and wherein the operating speed of the plurality of inverters determines an oscillating frequency of the ring oscillator, whereby the oscillating frequency of the ring oscillator varies depending on the value of the leakage current generated from the leakage current generating means.

2. A ring oscillator according to claim 1, wherein the inverters are provided in an odd number.

3. A ring oscillator according to claim 1, wherein the leakage current generating means comprises a first conductivity type semiconductor substrate and a second conductivity type region.

4. A ring oscillator according to claim 3, wherein the first conductivity type semiconductor substrate is a p-type semiconductor substrate.

5. A ring oscillator according to claim 3, wherein the first conductivity type semiconductor substrate is a p-type well.

6. A ring oscillator according to claim 3, wherein the second conductivity type region is an n-type diffusion region.

7. A ring oscillator according to claim 6, wherein the n-type diffusion region is formed as an n+ well.

8. A ring oscillator according to claim 6, wherein the n-type diffusion region is formed as an n− well.

9. A ring oscillator according to claim 1, wherein the current controlling means comprises a plurality of current mirror circuits.

10. A ring oscillator according to claim 9, wherein each of the current mirror circuits comprises a plurality of transistors.

11. A ring oscillator according to claim 9, wherein one of the current mirror circuits comprises a first number of transistors more than the number of the inverters.

12. A ring oscillator according to claim 11, wherein one of the remaining current mirror circuits comprises a second number of transistors more than the first number of transistors.

13. A ring oscillator according to claim 1, wherein the leakage current controlling means generates the leakage current correlatively with a leakage current generated from a memory cell.

14. A ring oscillator according to claim 13, wherein the leakage current generating means generates the leakage current in proportion to the leakage current generated from the memory cell.

* * * * *

UNITED STATES PATENT AND TRADEMARK OFFICE

CERTIFICATE OF CORRECTION

PATENT NO. : 5,410,278

GRANTED DATED : April 25, 1995

INVENTOR(S) : N. ITOH

It is certified that error appears in the above-identified patent and that said Letters Patent is hereby corrected as shown below:

Column 6,
Claim 13, line 2: reads "current controlling means",
should read --current generating means--.

Signed and Sealed this

Twenty-second Day of August, 1995

Attest:

BRUCE LEHMAN

Attesting Officer

Commissioner of Patents and Trademarks